United States Patent

Basile

[19]

[11] Patent Number: 4,719,413
[45] Date of Patent: Jan. 12, 1988

[54] RF CROSSPOINT TESTER

[75] Inventor: Philip C. Basile, Washington Township, Gloucester County, N.J.

[73] Assignee: RCA Corporation, Princeton, N.J.

[21] Appl. No.: 924,784

[22] Filed: Oct. 30, 1986

[51] Int. Cl.4 .......................................... G01R 23/16
[52] U.S. Cl. ................................. 324/77 B; 379/280; 324/77 C
[58] Field of Search ................. 324/77 R, 77 A, 77 B, 324/77 C, 77 CS, 77 E, 77 G, 78 F, 79 R, 79 D; 331/25; 379/280

[56] References Cited

U.S. PATENT DOCUMENTS 4,105,873  8/1978  Schimmel .............................. 379/280
4,105,875  8/1978  Schneider .............................. 379/280

*Primary Examiner*—Michael J. Tokar
*Attorney, Agent, or Firm*—Clement A. Berard, Jr.; William H. Meise; Christopher L. Maginniss

[57] ABSTRACT

An apparatus for testing the crosspoints of an RF switching matrix injects a test signal having the characteristics of noise into the matrix. The test signal recovered from the matrix is mixed with a frequency-swept signal and the difference signal is applied to a bandpass filter. The filter provides a window through which all of the frequency-shifted components of the recovered signal pass during the period of the frequency-swept signal. The total energy of the components in the window is continually monitored during the sweep period. A comb generator provides the test signal having a multiplicity of substantially equal amplitude components, uniformly spaced over a selected frequency spectrum. The frequency-swept signal is provided by a VCO having a sawtooth waveform input voltage. The amplitudes of the test signal components are sufficiently low that if coupling occurs between the test signal and a configured external antenna, the resulting transmission is virtually indistinguishable from noise.

18 Claims, 6 Drawing Figures

RF CROSSPOINT TESTER

The present invention relates generally to radio frequency (RF) communications systems and, in particular, to an apparatus for covertly testing the operational readiness of the crosspoints of a matrix used for switching between antennas and receivers/transmitters.

BACKGROUND OF THE INVENTION

The complexity of modern integrated radio rooms creates a need to monitor and evaluate the operational readiness of equipment used in the transmission and reception of RF signals. Because one of the major objectives of the radio room is to configure various antennas and couplers to receivers and transmitters, it is of prime importance that the crosspoints of a configuration switching matrix be monitored for operability.

These antenna/transceiver configurations are changed on a periodic basis. The operator must know if the present configuration is maintaining antenna-receiver/transmitter crosspoint connectivity without performance degradation. He must also be aware of the operational readiness of other crosspoints so that future configurations can be made with confidence.

In order to ascertain the quality of an RF crosspoint within a matrix, a signal similar in characteristics to the actual receive or transmit signal must be passed through the crosspoint. This technique produces the highest confidence of crosspoint status. However, if a signal is passed through an antenna crosspoint which is actively configured, there is a risk that this quality check will exit the radio room via that configured antenna. In tactical situations, where the radio room operates in a covert environment, any surveillance monitoring by an enemy will detect this signal presence and reveal the radio room location. For this reason noise is a widely used signal source for operational readiness testing.

The use of noise as a signal source poses several advantages in checking RF crosspoints. The noise spectrum is easy to generate in the frequency range of crosspoint operation. In addition, if the noise does exit the radio room, it will be difficult to detect. In most instances the radiated noise will be below either the atmospheric or kelvin thermal noise floor at the surveillance receiver and be undetectable.

The generation of noise as a signal source, however, has several technical deficiencies. The output level of the noise varies from unit to unit of the same design. Therefore, if a crosspoint is to be monitored for degraded performance, such as increased insertion loss, a high percentage of false alarms or undetected failures will result, depending on how the detected level thresholds are set. Only a gross go/no go decision can be made with a high degree of confidence. Furthermore, degradation in frequency response of a crosspoint cannot be detected via noise injection techniques, since the noise power must be integrated over the entire band.

SUMMARY OF THE INVENTION

In accordance with the principles of the present invention, an apparatus is disclosed for determining the quality of signal transmission through an array having an input and an output port. The apparatus comprises means coupled to the input port for applying a composite signal to the array, the composite signal comprising a multiplicity of substantially equal-amplitude frequency components. The apparatus additionally includes means for generating a frequency-varying signal in which the frequency of the signal is periodically swept uniformly across a predetermined frequency range. The apparatus also includes combining means coupled to the array output port and responsive to a signal received from the array, the received signal being the consequent of the composite signal passing through the array, the combining means combining the received signal with the frequency-varying signal such that the output signal of the combining means includes components having frequencies which are the frequencies of the received signal subtracted from the instantaneous frequency of the frequency-varying signal. The apparatus further includes means coupled to the combining means for enabling an output signal comprising a fixed band of frequencies of the combining means output signal. Means are provided for detecting the energy of the enabling means output signal and for providing an output signal having amplitude indicative of the signal energy. Finally, the apparatus comprises means for analyzing the amplitude of the detecting means output signal during the period of the frequency-varying signal.

DETAILED DESCRIPTION OF THE PREFERRED EMBODIMENT

Figure 1:
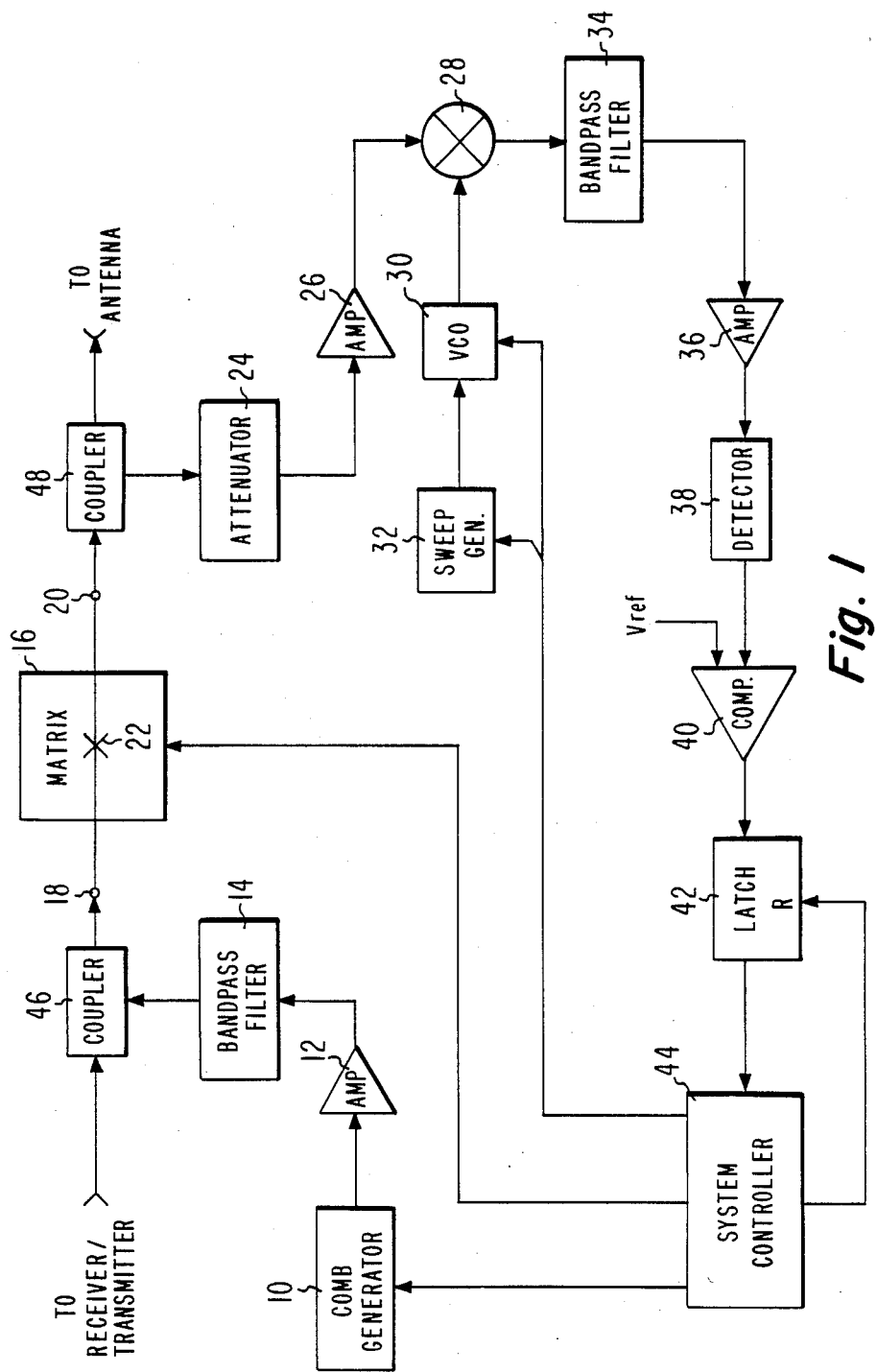
FIG. 1 is a detailed block diagram of an RF crosspoint tester according to present invention.

Referring to FIG. 1, there is shown an RF crosspoint tester according to the present invention. Switching matrix 16 is shown as having input port 18 and output port 20 which are interconnected within matrix by crosspoint 22. Although the symbolic representation of crosspoint 22 is that of a normally-open relay or switch contact, this is not to be construed as a limitation on the applicability of the crosspoint tester of the present invention.

Figure 2:
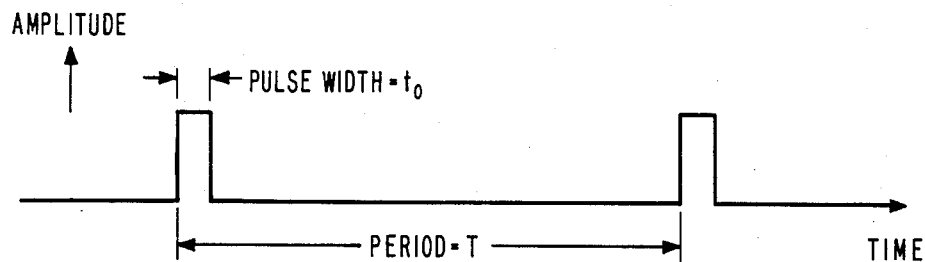
FIGS. 2 and 3 are time-and frequency-domain plots useful in understanding the operation of the comb generator of the FIG. 1 embodiment.
Figure 3:
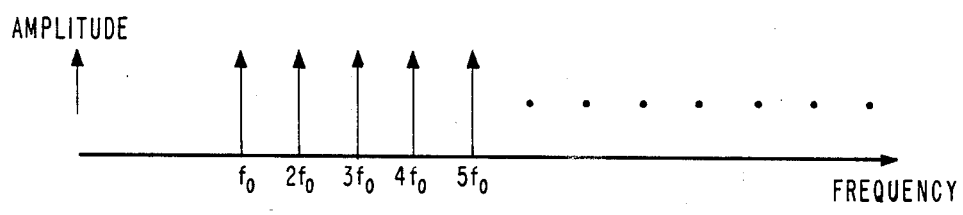

The signal stimulus to be input to crosspoint 22 is provided by comb generator 10. Comb generator 10 creates an energy spectrum from a periodic series of rectangular pulses. The resultant energy spectrum resembles noise, but it is comprised of a plurality of discrete frequency components. FIG. 2 illustrates a narrow rectangular signal pulse represented in a time-domain plot, and FIG. 3 is the equivalent frequency-domain plot showing the relative amplitude of the plurality of frequency components.

The amplitudes of these components are generated using the following Fourier equation:

$$C_n = 2A_v \sin(n\pi t_0/T)/(n\pi t_0/T)$$

where $C_n$ is the amplitude of the nth spectral component,
n is a positive integer,
$t_0$ is the pulse width of the rectangular pulse, T is the period of the pulse wave, and $A_\nu$ is the peak amplitude of the rectangular pulse multiplied by $t_o/T$.

It is well known that for small values of $\theta$, $\sin \theta$ is approximately equal to $\theta$. Thus, for small values of $(n\pi t_o/T)$ in the equation above, the amplitude values of all frequency components are substantially equal. As a quantitative example, it can be shown that a 50 nanosecond pulse which repeats every 500 microseconds generates, in the frequency domain, a series of frequency components which are integer multiples of 20 KHz, and which have substantially equal amplitudes (within 5% of the amplitude of the fundamental frequency) for at least the first 1500 harmonics, i.e., between 20 KHz and 30 MHz.

The use of comb generator 10 as the signal stimulus in the crosspoint tester of the present invention ensures a test signal which is similar to a noise spectrum and is highly stable and repeatable as regards amplitude level and frequency response. In addition, comb generator 10 produces covert characteristics similar to noise generation.

Figure 4:
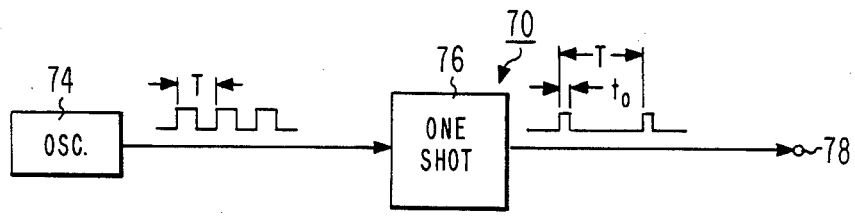
FIG. 4 illustrates a first embodiment of the comb generator of FIG. 1.

Referring to FIG. 4, there is shown an embodiment of a comb generator 70, which may be of the type used as comb generator 10 in FIG. 1. Comb generator 70 is suited for use at frequencies from about 10 KHz to about 50 MHz. It comprises a square wave generator 74 which produces a substantially square waveform having period equal to T. Generator 74 may illustratively be similar to timer circuit type MC1555G, sold by Motorola Semiconductor Products, Inc., Austin, Tex.

The output signal from generator 74 is coupled to one-shot 76, which may illustratively be similar to type DM74123, sold by National Semiconductor Corp., Santa Clara, Calif. One-shot 76 is configured to provide a pulse of predetermined width to output terminal 78 in response to a particular edge of its input signal. This configuration may require the use of an external resistor and/or capacitor (not shown) coupled to one-shot 76, in a manner well known in the art and described in applications notes for the 74123 device.

Figure 5:
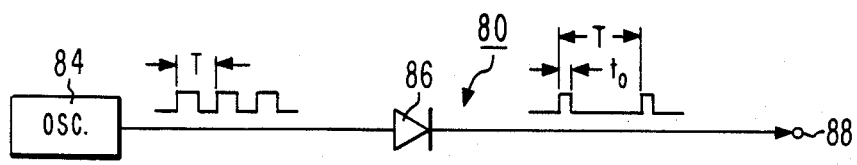
FIG. 5 illustrates a second embodiment of the comb generator of FIG 1.

The FIG. 4 embodiment of a comb generator 70 provides adequate waveforms for generating frequency components up to about 50 MHz. Above that, a second embodiment of comb generator, shown in FIG. 5 is recommended. Comb generator 80 of FIG. 5 comprises square wave generator 84 which may be similar to generator 74 of the FIG. 4 embodiment. Generator 84 produces a substantially square waveform having period equal to T.

The output signal from generator 84 is coupled to the anode of step recovery diode 86, which may illustratively be similar to type HP5082-0112, sold by Hewlett-Packard Microwave Semiconductor Div., Palo Alto, Calif. Step recovery diode 86 is a negative resistance device which responds to a particular level of an input waveform by conducting for a very short time period, then blocking. The output pulse from diode 86, having duration $t_o$, is applied to output terminal 88. The step recovery diode cited above by way of example, extends the operation of comb generator 80 to at least 1.5 gigahertz.

Referring once more to FIG. 1, the individual frequency components of the wide spectrum signal output from comb generator 10 are very low in amplitude, as they have the same total energy as the narrow-pulse signal used in generator 10 (described earlier in FIGS. 2–5) to produce the broadband output signal. Typically, the individual frequency components from comb generator 10 are 10–50 db down from the amplitude of the narrow-pulse signal. Therefore, RF amplifier 12 is provided to increase the overall amplitude of the output signal from comb generator 10 above the noise floor to a level which is detectable at the output side of matrix 16, but not so high as to be recognized at a hostile listening post as anything other than noise. Bandpass filter 14 receives the amplified signal from amplifier 12 and passes only those lower frequency components which have substantially equal amplitudes, while blocking the frequency components from comb generator 10 which are below the frequency range of the intended test.

The output signal from filter 14 is coupled to matrix 16 at input port 18 via coupler 46, passes through one or more crosspoints, shown illustratively as a single crosspoint 22, and emerges from matrix 16 at output port 20. The signal at port 20 is passed through coupler 48, RF attenuator 24 and RF amplifier 26 and is then coupled to a first input terminal of RF mixer 28. Couplers 46 and 48 provide means for coupling the test signal from filter 14 into matrix 16 and coupling the signal from matrix 16 to attenuator 24, while the matrix connection between a receiver/transmitter and antenna remains configured. Couplers 46 and 48 are typically directional couplers providing, illustratively, through-path attenuation of 0.5 db and branch-path attenuation of 20 db. In the example shown, the through paths of couplers 46 and 48 couple the receiver/transmitter through matrix 16 to an antenna, while the branch paths couple the test signal generated by comb generator 10 through matrix 16, from filter 14 to attenuator 24.

Attenuator 24 and amplifier 26 adjust the level of the signal received from matrix 16 to a level appropriate for use by mixer 28. RF mixer 28 may typically be an RF double balanced mixer which generates a difference frequency output signal by subtracting the frequency of the signal applied at its first input terminal from the frequency of the signal applied at its second input terminal. Mixer 28 may illustratively be similar to type SRA-1, sold by Minicircuits Corp., of Brooklyn, N.Y.

The signal to be applied to the second input terminal of RF mixer 28 is provided by voltage-controlled oscillator (VCO) 30. VCO 30 responds to the signal at its control input terminal to generate an output signal having frequency dependent on the voltage level of its input signal. In general, increasing the voltage level of the input signal increases the frequency of the VCO output signal. In the present invention, the input signal provided to VCO 30 is supplied by sweep generator 32 which generates a sawtooth waveform which is substantially linear over the period of sweep.

Sweep generator 32 may illustratively comprise a type MC1555G timer circuit, similar to the circuit suggested for use in the FIG. 4 and 5 embodiments of the comb generator, but configured for sweep generator 32 as a sawtooth wave generator, according to the application notes for the circuit. Thus, as sweep generator 32 provides a periodic voltage-varying signal to the control input terminal of VCO 30 having a period of duration T, VCO 30 generates a frequency sweep signal to the second input terminal of RF mixer 28, wherein the frequency is repetitively swept between a first and a second value, during each period of the sawtooth output signal from generator 32.

A second function provided by RF attenuator 24 and RF amplifier 26 is that of isolating the sweep-frequency signal at the second input terminal of mixer 28 from switching matrix 16. As an example of how this isolation is provided, consider that the two input terminals of mixer 28 are isolated from each other by −20db, and that RF amplifier supplies the same attenuation power ratio in the reverse direction as it provides gain in the forward direction. Thus, if 10db of gain is required between coupler 48 and mixer 28, then amplifier 26 amplifies 10db and, therefore, attenuates by −10db in the reverse direction, and the sweep-frequency signal from generator 30 is isolated from coupler 48 by only −30db. However, the addition of a −20db attenuator 24 requires that amplifier 26 provide a gain of 30db (and therefore an attenuation of −30db in the reverse direction). Since attenuator 24 provides the same attenuation in either direction, the isolation between sweep-frequency generator 30 and coupler 48 in this configuration is −70db.

The range of frequencies through which the output signal of VCO 30 sweeps is determined in the following manner. The difference frequency output from mixer 28 is the instantaneous sweep frequency minus the RF test signal recovered from matrix 16. Selecting a desired difference frequency of, for example, 200 KHz, and using the range of frequency components cited earlier by way of example for the test signal, i.e., 2 MHz to 30 MHz at 20 KHz spacing, it is easily seen that the frequency sweep range of VCO 30 must be 2.2 MHz to 30.2 MHz.

Using the values of the above paragraph, it may be seen that at the first instant, when VCO 30 begins its sweep, the output signal of mixer 28 has components of 200, 180, 160, 140, . . . 40 and 20 KHz, and as the VCO 30 output frequency increases, additional frequency components of 220 KHz, 240 KHz, . . . , spaced at 20 KHz apart, begin to appear in sequence at the mixer 28 output. Finally, at the end of the frequency sweep by VCO 30, frequency components from 200 KHz to 30.18 MHz are included in the output signal from mixer 28.

Bandpass filter 34 is coupled to the output of mixer 28 to enable only a small range of frequencies to be passed through to the remaining elements of the tester. Using the values previously set forth by way of example, filter 34 may typically have a passband of 100 KHz, typically passing frequencies between 100 and 200 KHz. Thus, as VCO 30 sweeps through its frequency range, and mixer 28 provides output signal frequencies which are the difference between the swept frequencies and the composite signal received from matrix 16, filter 34 provides a window through which all frequencies of the composite signal pass, illustratively, five at a time. In other words, the 100 KHz passband of filter 34 provides a window for passing five frequency components spaced 20 KHz apart.

Figure 6:
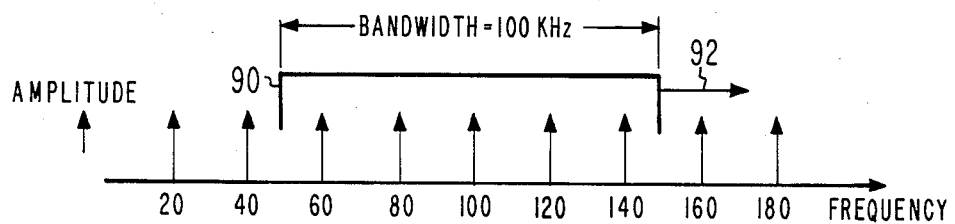
FIG. 6 is an amplitude vs. frequency plot useful in understanding the FIG. 1 embodiment.

FIG. 6 illustrates the moving window effect that sweep generator 32, VCO 30, mixer 28 and bandpass filter 34 have on the frequency components of the test signal, received from matrix 16. The amplitude vs. frequency plot illustrates the test signal components. The window, shown as the three-sided box 90 above the components and encompassing a fixed number of them (illustratively, five), represents the frequency band of bandpass filter 34. The arrow 92 indicating movement of the window, represents the sweeping effect of sweep generator 32 and VCO 30, demonstrating that the total effect of all of these devices is to scan the full range of frequency components of the test signal, viewing a fixed number of them at any time.

It is recognized that mixer 28 may also generate frequency components representing the sum of its input frequencies, as well as components at the sweeping VCO frequency, although the latter are significantly lower in amplitude than the difference and sum components. Therefore, judicious selection of the passband of filter 34 and of the sweep frequency range of VCO 30, relative to the frequency components of the test signal received from matrix 16, will ensure that these unwanted frequency components, that is, the sum term from mixer 28 and the primary VCO frequency, as well as their harmonics, will not be carried past filter 34.

The bandwidth-limited signal output from filter 34 is applied to RF amplifier 36 which amplifies the levels of the signal frequency components to amplitudes compatible with the input requirements of detector 38. In practice, the amplification requirement at this stage may be such that two or more cascaded RF amplifiers may be needed as amplifier 36.

The amplified signal is applied to detector 38, which may typically be a noncoherent RF detector which detects the presence and measures the level of the total RF energy input from amplifier 36. The output signal from detector 38 is a dc level which reflects the total RF energy applied to its input.

The detector 38 output signal is applied to one input terminal of comparator circuit 40; the other input terminal is coupled to a potential source (not shown) for providing a predetermined voltage level $V_{ref}$. In a typical arrangement, comparator 40 may be configured such that it generates an output signal of a first logic level when the output signal from detector 38 exceeds the predetermined reference voltage, and generates a second logic level output signal when the output signal from detector 38 falls below $V_{ref}$.

The logic level output signal from comparator 40 is applied to a digital logic storage element 42, typically a latch, which is arranged to be triggered into an alarm state upon the detection of insufficient RF energy by detector 38, and remain in that alarm state until reset. The output signal from latch 42 is coupled for alarm detection to system controller 44, typically a computer-controlled processor, which maintains control over the operations of the several elements of the crosspoint tester.

In the embodiment of FIG. 1, system controller 44 enables operation of comb generator 10, VCO 30 and sweep generator 32. It selects the path to be tested through matrix 16 by, illustratively, enabling closure of crosspoint 22. In addition, controller 44 resets latch 42 prior to the voltage sweep by sweep generator 32 and monitors the output signal from latch 42 during the sweep.

Bandpass filter 34 must have a sufficient bandwidth to allow detector 38 to receive enough frequency components that the total energy has an acceptable signal-to-noise ratio, without requiring such high amplitudes of the frequency components from comb generator 10 that detectable energy might exit matrix 16 via an antenna. Nevertheless, the bandwidth of filter 34 must also be sufficiently narrow as to permit detector 38 to sense abnormal level variations of energy emerging from matrix 16 as a function of frequency.

While the principles of the present invention have been demonstrated with particular regard to the illustrated structure and method of the figures, it will be recognized that various departures from such illustrative structure and method may be undertaken in prac-

What is claimed is:

1. An apparatus for determining the quality of signal transmission through an array, said array having an input and an output port, said apparatus comprising:
    means coupled to said input port for generating a composite signal into said array, said composite signal comprising a multiplicity of substantially equal-amplitude frequency components;
    means for generating a frequency-varying signal in which the frequency of said signal is periodically swept uniformly across a predetermined frequency range;
    means coupled to said array output port and responsive to a signal received from said array, said received signal being the consequent of said composite signal passing through said array, for combining said received signal with said frequency-varying signal, such that the output signal of said combining means includes components having frequencies which are the frequencies of the components of said received signal subtracted from the instantaneous frequency of said frequency-varying signal;
    means coupled to said combining means for enabling an output signal comprising a fixed band of frequencies of said combining means output signal;
    means for detecting the energy of said enabling means output signal and for providing an output signal having amplitude indicative of said signal energy; and
    means for analyzing the amplitude of said detecting means output signal during the period of said frequency-varying signal.

2. The apparatus according to claim 1 wherein said means for generating a composite signal includes a comb generator.

3. The apparatus according to claim 2 wherein said comb generator comprises pulse generating means responsive to a periodic signal for generating a signal pulse of very short duration relative to the period of said periodic signal.

4. The apparatus according to claim 3 wherein said pulse generating means comprises a one-shot circuit.

5. The apparatus according to claim 3 wherein said pulse generating means comprises a step-recovery diode.

6. The apparatus according to claim 1 wherein said means for generating a frequency-varying signal includes a sawtooth generator and a voltage-controlled oscillator (VCO), said sawtooth generator providing a sawtooth voltage waveform at the control input terminal of said VCO.

7. The apparatus according to claim 1 wherein said combining means comprises a balanced mixer.

8. The apparatus according to claim 1 wherein said enabling means comprises a bandpass filter.

9. The apparatus according to claim 1 wherein said analyzing means includes a voltage comparator for comparing the amplitude of said detecting means output signal with a predetermined reference voltage.

10. The apparatus according to claim 1 further including means coupled between said array output port and said combining means for electrically isolating said frequency-varying signal from said array.

11. The apparatus according to claim 10 wherein said isolating means includes an RF attenuator in series with an RF amplifier.

12. An apparatus for determining the quality of signal transmission through a switching crosspoint, said crosspoint having first and second ports, said apparatus comprising:
    a comb generator coupled to said first port for generating a composite signal into said crosspoint, said composite signal comprising a multiplicity of substantially equal-amplitude frequency components;
    means, including a sawtooth voltage generator driving a voltage-controlled oscillator, for generating a frequency-varying signal, wherein the frequency of said signal is periodically swept uniformly across a predetermined frequency range;
    a mixer coupled to said second crosspoint port and responsive to a signal received from said crosspoint, said received signal being the consequent of the said composite signal passing through said crosspoint, said mixer providing an output signal including components having frequencies which are the frequencies of the components of said received signal subtracted from the instantaneous frequency of said frequency-varying signal;
    a bandpass filter coupled to said mixer, said filter providing an output signal comprising a fixed band of frequencies of said mixer output signal;
    means for detecting the energy of said filter output signal and for providing an output signal having amplitude indicative of said signal energy; and
    means for analyzing the amplitude of said detecting means output signal during the period of said frequency-varying signal.

13. The apparatus according to claim 12 wherein said comb generator comprises pulse generating means responsive to a periodic signal for generating a signal pulse of very short duration relative to the period of said periodic signal.

14. The apparatus according to claim 13 wherein said pulse generating means comprises a one-shot circuit.

15. The apparatus according to claim 12 wherein said pulse generating means comprises a step-recovery diode.

16. The apparatus according to claim 12 further including means coupled between said second crosspoint port and said mixer for electrically isolating said frequency-varying signal from said crosspoint.

17. The apparatus according to claim 16 wherein said isolating means includes an RF attenuator in series with an RF amplifier.

18. A method for determining the quality of signal transmission range through an array, said array having an input and an output port, said method comprising the steps of:
    a. generating a composite signal into said array at said input port, said composite signal comprising a multiplicity of substantially equal-amplitude frequency components;
    b. generating a frequency-varying signal in which the frequency of said signal is periodically swept uniformly across a predetermined frequency range;
    c. combining the signal received from said array at said output port with said frequency-varying signal, said received signal being the consequent of said composite signal passing through said array, wherein the output signal of said combining means includes components having frequencies which are the frequencies of the components of said received signal subtracted from the instantaneous frequency of said frequency-varying signal;

d. filtering said combining means output signal so as to provide a filtered signal comprising a fixed band of frequencies of said combining means output signal;

e. detecting the energy of said filtered signal and providing an output signal having amplitude indicative of said signal energy; and f. analyzing the amplitude of said detecting means output signal during the period of said frequency-varying signal.

* * * * *